United States Patent
Nagano et al.

(10) Patent No.: US 11,329,644 B2
(45) Date of Patent: May 10, 2022

(54) GATE DRIVE APPARATUS, SWITCHING APPARATUS, AND GATE DRIVE METHOD

(71) Applicant: FUJI ELECTRIC CO., LTD., Kanagawa (JP)

(72) Inventors: Tsuyoshi Nagano, Hino (JP); Kunio Matsubara, Hino (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 17/103,723

(22) Filed: Nov. 24, 2020

(65) Prior Publication Data

US 2021/0083663 A1  Mar. 18, 2021

Related U.S. Application Data

(63) Continuation of application No. 16/794,224, filed on Feb. 19, 2020, now Pat. No. 10,855,272.

(30) Foreign Application Priority Data

Jun. 10, 2019 (JP) .............................. JP2019-108183

(51) Int. Cl.
| | | |
|---|---|---|
| H03K 17/16 | (2006.01) | |
| H02M 1/08 | (2006.01) | |
| H02M 1/00 | (2006.01) | |

(52) U.S. Cl.
CPC ............ *H03K 17/165* (2013.01); *H02M 1/08* (2013.01); *H02M 1/0054* (2021.05)

(58) Field of Classification Search
CPC .... H03K 17/16; H03K 17/165; H03K 17/161; H02M 1/08; H02M 1/088

USPC ........................ 327/108–112; 326/82, 83, 87
See application file for complete search history.

(56) References Cited

U.S. PATENT DOCUMENTS

| | | |
|---|---|---|
| 7,848,126 B2 | 12/2010 | Hartlieb |
| 10,505,535 B2 | 12/2019 | Matsubara |
| 2010/0231269 A1 | 9/2010 | Nakatake |
| 2010/0237841 A1 | 9/2010 | Matsuo |

(Continued)

FOREIGN PATENT DOCUMENTS

| | | |
|---|---|---|
| JP | 4935266 B2 | 5/2012 |
| JP | 2018191423 A | 11/2018 |

OTHER PUBLICATIONS

U.S. Appl. No. 16/794,224, filed Feb. 19, 2020, to Tsuyoshi Nagano et al.

*Primary Examiner* — Tomi Skibinski

(57) ABSTRACT

A gate drive apparatus is provided. The gate drive apparatus includes a gate drive unit configured to drive a gate of a switching device; a parameter measuring unit configured to measure a parameter corresponding to current flowing through the switching device; a discrepancy detection unit configured to detect discrepancy between current flowing through the switching device during an on-state of the switching device and a reference value, based on the parameter; and a control unit that, if the discrepancy is not detected, switches a change speed of a gate voltage of the switching device at a timing when a reference time has elapsed since a turn-off start of the switching device during a next turn-off time period of the switching device, and if the discrepancy is detected, keeps the change speed of the gate voltage during the next turn-off time period of the switching device.

20 Claims, 5 Drawing Sheets

(56) References Cited

U.S. PATENT DOCUMENTS

| | | |
|---|---|---|
| 2013/0147523 A1 | 6/2013 | Deboy |
| 2014/0313798 A1 | 10/2014 | Eum |
| 2017/0093392 A1* | 3/2017 | Kobayashi ............ H03K 3/012 |
| 2019/0190511 A1 | 6/2019 | Matsubara |
| 2020/0036380 A1 | 1/2020 | Matsubara |

* cited by examiner

GATE DRIVE APPARATUS, SWITCHING APPARATUS, AND GATE DRIVE METHOD

CROSS-REFERENCE TO RELATED APPLICATIONS

This application is a continuation of U.S. patent application Ser. No. 16/794,224, filed on Feb. 19, 2020, which claims priority to Japanese Patent Application No. 2019-108183 filed in JP on Jun. 10, 2019, the contents of each of which is incorporated herein by reference in their entirety.

BACKGROUND

1. Technical Field

The present invention relates to a gate drive apparatus, a switching apparatus, and a gate drive method.

2. Related Art

In the related art, a gate drive apparatus configured to drive a gate of a switching device performs an active drive of switching a change speed of a gate voltage from a high speed to a low speed during a turn-off time period, based on parameters and the like measured in an immediately previous switching cycle, thereby reducing a surge voltage and a switching loss upon turn-off (for example, refer to Patent Document 1).

Patent Document 1: Japanese Patent No. 4,935,266B

Technical Problem

However, when current flowing through the switching device changes largely, a timing of the occurrence of the surge voltage after the start of the turn-off, so that the surge voltage may not be reduced.

SUMMARY

In order to solve the aforementioned problem, a first aspect of the present invention provides a gate drive apparatus. The gate drive apparatus may include a gate drive unit configured to drive a gate of a switching device. The gate drive apparatus may include a parameter measuring unit configured to measure a parameter corresponding to current flowing through the switching device. The gate drive apparatus may include a discrepancy detection unit configured to detect discrepancy between current flowing through the switching device during an on-state of the switching device and a reference value, based on the parameter. The gate drive apparatus may include a control unit that, if the discrepancy is not detected, switches a change speed of a gate voltage of the switching device at a timing when a reference time has elapsed since a turn-off start of the switching device during a next turn-off time period of the switching device, and if the discrepancy is detected, keeps the change speed of the gate voltage during the next turn-off time period of the switching device.

The reference value may be the parameter measured by the parameter measuring unit during a previous on-state of the switching device. The reference value may be a fixed value.

The reference time may be a time from a previous turn-off start of the switching device to a timing earlier than a timing at which a voltage between main terminals of the switching device is the highest.

The reference time may be a time from a previous turn-off start of the switching device to a timing at which a Miller time period of the gate voltage ends.

If the discrepancy is not detected, the control unit may switch the change speed of the gate voltage from a speed S1 to a speed S2 (S1>S2) at the timing when the reference time has elapsed since the turn-off start of the switching device during the next turn-off time period of the switching device. If the discrepancy is detected, the control unit may keep the change speed of the gate voltage at a speed S3 (S1>S3) during the next turn-off time period of the switching device.

The gate drive apparatus may further include a correction unit that, if the change speed of the gate voltage during a period from a previous turn-off start of the switching device to the timing when the reference time has elapsed since then is the speed S3, corrects the reference time to be used during the next turn-off time period of the switching device.

A second aspect of the present invention provides a gate drive apparatus. The gate drive apparatus may include a gate drive unit configured to drive a gate of a switching device. The gate drive apparatus may include a parameter measuring unit configured to measure a parameter corresponding to current flowing through the switching device. The gate drive apparatus may include a control unit configured to set a change speed of a gate voltage of the switching device during a period from a turn-off start of the switching device to a timing when a reference time has elapsed since then to any of a plurality of speeds, based on the parameter. The gate drive apparatus may include a correction unit configured to correct the reference time to be used during a next turn-off time period of the switching device, based on a change speed of the gate voltage during a period from a previous turn-off start of the switching device to the timing when the reference time has elapsed since then.

The control unit may be configured to switch the change speed of the gate voltage from a speed S1 to a speed S2 or to keep the change speed at a speed S3 at a timing when a reference time has elapsed since the turn-off start during the turn-off time period of the switching device, based on the parameter.

The speed S1 may be greater than each of the speed S2 and the speed S3.

The correction unit may correct the reference time if the change speed of the gate voltage during the period from the previous turn-off start of the switching device to the timing when the reference time has elapsed since then is the speed S3.

The gate drive apparatus may further include an elapsed time measuring unit configured to measure an elapsed time from a turn-off start of the switching device to a timing at which a reference event occurs, in each switching cycle. The control unit may be configured to use, as the reference time, the elapsed time in a previous switching cycle. The correction unit may convert the elapsed time in the previous switching cycle in a case in which the change speed of the gate voltage is the speed S3 into the elapsed time in a case in which the change speed is the speed S1.

The correction unit may be configured to convert the elapsed time in the case of the speed S3 into the elapsed time in the case of the speed S1 by counting down the elapsed time with a count speed corresponding to a ratio of the speed S3 to the speed S1.

The reference event may be an event in which a voltage between main terminals of the switching device becomes a reference voltage. The reference event may be an event in which a Miller time period of the gate voltage of the switching device ends.

The parameter may be a duration of an on-state period of the switching device. The parameter may be current flowing through the switching device when the switching device is in an on-state.

A third aspect of the present invention provides a switching apparatus. The switching apparatus may include the gate drive apparatus according to the first or second aspect. The switching apparatus may include the switching device in which a gate is to be driven by the gate drive apparatus.

The switching device may be a wide bandgap semiconductor element.

A fourth aspect of the present invention provides a gate drive method. The gate drive method may include parameter measuring of measuring a parameter corresponding to current flowing through a switching device when driving a gate of the switching device. The gate drive method may include discrepancy detecting of detecting discrepancy between current flowing through the switching device during an on-state of the switching device and a reference value, based on the parameter. The gate drive method may include controlling of, if the discrepancy is not detected, switching a change speed of a gate voltage of the switching device at a timing when a reference time has elapsed since a turn-off start of the switching device during a next turn-off time period of the switching device, and if the discrepancy is detected, keeping the change speed of the gate voltage during the next turn-off time period of the switching device.

A fifth aspect of the present invention provides a gate drive method. The gate drive method may include parameter measuring of measuring a parameter corresponding to current flowing through a switching device when driving a gate of the switching device. The gate drive method may include controlling of setting a change speed of a gate voltage of the switching device during a period from a turn-off start of the switching device to a timing when a reference time has elapsed since then to any of a plurality of speeds, based on the parameter. The gate drive method may include correcting of correcting the reference time to be used during a next turn-off time period of the switching device, based on a change speed of the gate voltage during a period from a previous turn-off start of the switching device to the timing when the reference time has elapsed since then.

The summary of the present invention described above does not necessarily describe all necessary features of the present invention. The present invention may also be a sub-combination of the features described above

DESCRIPTION OF EXEMPLARY EMBODIMENTS

Hereinbelow, embodiments of the present invention will be described.

However, the embodiments below do not limit the invention defined in the claims. Also, all combinations of features described in the embodiments are not necessarily essential to solving means of the invention.

1. Configuration of Switching Apparatus 100

Figure 1:
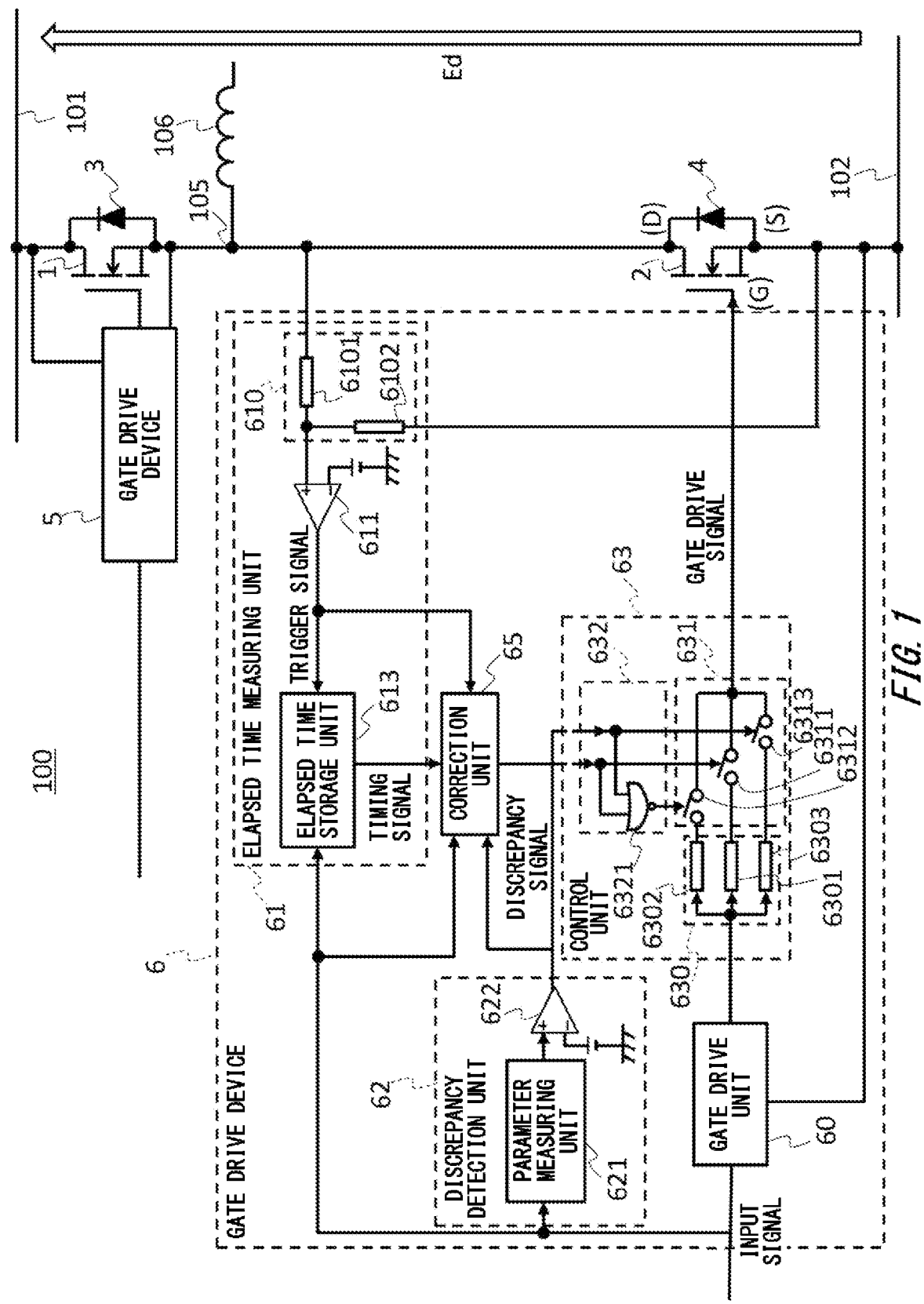
FIG. 1 shows a switching apparatus 100 in accordance with an embodiment.

FIG. 1 shows a switching apparatus 100 in accordance with an embodiment. In FIG. 1, an outlined arrow indicates a voltage.

The switching apparatus 100 shows one phase of a power conversion apparatus that is used for motor drive or power feed, for example, and is configured to output a converted voltage from a power supply output terminal 105 by switching connection between a positive-side power supply line 101 and a negative-side power supply line 102 and the power supply output terminal 105.

Herein, for example, a DC voltage Ed of 600V to 800V is applied between the positive-side power supply line 101 and the negative-side power supply line 102, and the negative-side power supply line 102 is connected to an entire reference potential (as an example, a ground potential) of the switching apparatus 100. The power supply output terminal 105 may be connected with an induction load 106. The switching apparatus 100 includes a positive-side switching device 1, a negative-side switching device 2, freewheeling diodes 3 and 4 connected in antiparallel to the switching devices 1 and 2, a positive-side gate drive apparatus 5 and a negative-side gate drive apparatus 6.

[1-1. Switching Devices 1 and 2] The switching devices 1 and 2 are respectively configured to electrically connect and disconnect a drain terminal and a source terminal therebetween. For example, the switching devices 1 and 2 are respectively configured to switch an on-state (also referred to as 'connection') and an off-state (also referred to as 'disconnection') by gate drive apparatus 5 and 6, which will be described later. Herein, in the present embodiment, as an example, the switching devices 1 and 2 are sequentially connected in series between the negative-side power supply line 102 and the positive-side power supply line 101, and constitute an upper arm and a lower arm of the power conversion apparatus. A center point between the switching devices 1 and 2 is connected with the power supply output terminal 105.

Each of the switching devices 1 and 2 is a silicon semiconductor element based on silicon. Instead, at least one of the switching devices 1 and 2 may be a wide bandgap semiconductor element. The wide bandgap semiconductor element is a semiconductor element in which a bandgap is greater than that of a silicon semiconductor element, and is, for example, a semiconductor element including SiC, GaN, diamond, a gallium nitride-based material, a gallium oxide-based material, AlN, AlGaN, ZnO, or the like. The wide bandgap semiconductor element can improve a switching speed, as compared to the silicon semiconductor element. In the present embodiment, the switching devices 1 and 2 are respectively a MOSFET (Metal Oxide Semiconductor Field Effect Transistor), and may include a parasitic diode (not shown) of which a side facing toward the positive-side power supply line 101 is a cathode.

[1-2. Freewheeling Diodes 3 and 4] The freewheeling diodes 3 and 4 are connected in antiparallel to the switching devices 1 and 2. The freewheeling diodes 3 and 4 may be a Schottky barrier diode or a parasitic diode of a MOSFET, respectively. The freewheeling diodes 3 and 4 may be a silicon semiconductor element or a wide bandgap semiconductor element, respectively.

[1-3. Gate Drive Apparatus 5 and 6] The gate drive apparatus 5 and 6 are configured to drive gates of the corresponding switching devices 1 and 2, based on an input signal to be input from an outside. The input signal may control the switching devices 1 and 2 in a PWM control manner, thereby outputting AC current of a substantial sine wave from the power supply output terminal 105. The input signal may be individually input to the switching device 1 and the switching device 2. In the present embodiment, as an example, in a case in which the input signal is high (on-command signal), it instructs the switching device 2 to be in an on-state, and in a case in which the input signal is low (off-command signal), it instructs the switching device 2 to be in an off-state.

The positive-side gate drive apparatus 5 is configured to drive the gate of the switching device 1, and the negative-side gate drive apparatus 6 is configured to drive the gate of the switching device 2. In the meantime, the gate drive apparatus 5 and 6 have similar configurations. Therefore, in the present embodiment, the negative-side gate drive apparatus 6 is described, and the descriptions of the positive-side gate drive apparatus 5 are omitted.

The gate drive apparatus 6 includes a gate drive unit 60, an elapsed time measuring unit 61, a discrepancy detection unit 62, a control unit 63, and a correction unit 65. In the present embodiment, as an example, each unit of the gate drive apparatus 6 is described as an analog circuit.

[1-3-1. Gate Drive Unit 60] The gate drive unit 60 is configured to drive the gate of the switching device 2, based on a turn-on signal and a turn-off signal included in the input signal from the outside. The gate drive unit 60 is configured to supply gate drive signals (on-command signal/off-command signal) for on and off instructions to a gate terminal of the switching device 2. The gate drive unit 60 may be configured to supply the gate drive signals to the switching device 2 via the control unit 63. The gate drive unit 60 may be connected to a source terminal of the switching device 2, and may be configured to use a potential of the source terminal as a reference potential of the gate drive signal.

[1-3-2. Elapsed Time Measuring Unit 61] The elapsed time measuring unit 61 is configured to measure an elapsed time from a turn-off start of the switching device 2 to a timing at which a reference event occurs, in each switching cycle. An elapsed time (also referred to as 'previous elapsed time') measured in a previous switching cycle is used as a reference time for determining a switching timing when switching a change speed of a gate voltage during a next turn-off time period.

As an example, the reference event may be an event in which a voltage between main terminals of the switching device 2 (in the present embodiment, as an example, a voltage $V_{ds}$ to be applied between the source terminal and the drain terminal) is a reference voltage $V_{ref}$. That is, the reference voltage $V_{ref}$ may be lower than a peak voltage of the surge voltage. Thereby, the previous elapsed time, i.e., the reference time that is used so as to switch the change speed of the gate voltage during the next turn-off time period is a time from a previous turn-off start of the switching device 2 to a timing earlier than a timing at which the voltage $V_{ds}$ between main terminals of the switching device 2 is the highest. The elapsed time measuring unit 61 includes a voltage detection circuit 610, a comparator 611, and an elapsed time storage unit 613.

[1-3-2-1. Voltage Detection Circuit 610] The voltage detection circuit 610 is configured to detect the voltage $V_{ds}$ applied between the source terminal and the drain terminal. For example, the voltage detection circuit 610 has resistors 6101 and 6102 for dividing the voltage $V_{ds}$. A center point between the resistors 6101 and 6102 is connected to the comparator 611, so that the detected voltage $V_{ds}$ is supplied to the comparator 611. In the present embodiment, the detected voltage is a positive voltage when the potential on the drain terminal is higher than that on the source terminal side.

[1-3-2-2. Comparator 611] The comparator 611 is configured to compare the voltage $V_{ds}$ detected by the voltage detection circuit 610 with the reference voltage $V_{ref}$. For example, the voltage $V_{ds}$ may be input to a non-inverting input terminal of the comparator 611, and the reference voltage $V_{ref}$ may be input to an inverting input terminal. The comparator 611 is configured to supply a trigger signal to the elapsed time storage unit 613 and the correction unit 65, in response to the voltage $V_{ds}$ becoming higher than the reference voltage $V_{ref}$.

[1-3-2-3. Elapsed Time Storage Unit 613] The elapsed time storage unit 613 is configured to measure and store the elapsed time from the turn-off start of the switching device 2 to the timing at which the reference event occurs, for each turn-off time period of the switching device 2. For example, the elapsed time storage unit 613 may be configured to detect, as a turn-off start timing of the switching device 2, a reception timing of the off-command signal included in the input signal to the gate drive unit 60, and to measure the elapsed time from the detected start timing to reception of the trigger signal.

The elapsed time storage unit 613 is configured to output a timing signal, which is switched at a timing when a previous elapsed time has elapsed since a reception timing of the on-command signal included in the input signal to the gate drive unit 60, and to supply the same to the control unit 63 via the correction unit 65, during the turn-off time period of each switching cycle. In the present embodiment, as an example, the timing signal may rise from low to high at the reception timing of the on-command signal, and fall from high to low at the timing when the previous elapsed time has elapsed since the reception timing. The elapsed time storage unit 613 may be reset whenever the off-command signal is received.

[1-3-3. Discrepancy Detection Unit 62] The discrepancy detection unit 62 is configured to detect discrepancy between current flowing through the switching device 2 during an on-state of the switching device 2 and a reference value. As used herein, the discrepancy between the current and the reference value may be such discrepancy that a difference between the current and the reference value becomes greater than a preset margin. The discrepancy detection unit 62 may be configured to detect the discrepancy of the current, based on a parameter corresponding to the current flowing through the switching device 2, and to output a discrepancy signal indicating whether or not the discrepancy. The discrepancy detection unit 62 includes a parameter measuring unit 621, and a comparator 622.

The parameter measuring unit 621 is configured to measure a parameter corresponding to the current flowing through the switching device 2 (for example, the current $I_d$ flowing through the drain terminal). Herein, the current flowing through the switching device 2 may be an instantaneous value of the current flowing through the switching device 2 in the on-state, and becomes greater as the on-state period becomes longer. For this reason, in the present embodiment, as an example, a duration of the on-state period of the switching device 2 is used as the parameter.

The parameter measuring unit 621 may be configured to detect the reception timing of the on-command signal included in the input signal to the gate drive unit 60, as a start timing of the on-state period of the switching device 2.

The parameter measuring unit 621 may be configured to detect the reception timing of the off-command signal included in the input signal to the gate drive unit 60, as an end timing of the on-state period of the switching device 2. The parameter measuring unit 621 is configured to supply a voltage corresponding to the measured duration of the on-state period to the comparator 622. In the present embodiment, the parameter measuring unit 621 is reset whenever the on-command signal is received but may be reset whenever the off-command signal is received.

The comparator 622 is configured to determine whether the current flowing through the switching device 2 deviates from the reference value, based on the parameter supplied from the parameter measuring unit 621. For example, a voltage corresponding to the measured duration of the on-state period, i.e., a voltage corresponding to the current flowing through the switching device 2 may be input to a non-inverting input terminal of the comparator 622, and a voltage corresponding to a threshold value obtained by adding a margin to a reference value of the parameter may be input to an inverting input terminal. As used herein, the reference value may be a fixed value. In the present embodiment, as an example, the reference value is a current value that indicates the current flowing through the switching device 2 in the on-state and at which a surge voltage generated as a result of the immediate turn-off of the switching device 2 becomes less than a device breakdown voltage. However, the reference value may be a variable value, and may be, for example, a duration of the on-state period measured by the parameter measuring unit 621 while the switching device 2 was in the previous on-state. The margin may be any value. The comparator 622 is configured to supply a discrepancy signal (in the present embodiment, as an example, a discrepancy signal becoming high), which indicates that the current deviates from the reference value, to the correction unit 65 and the control unit 63, in response to the measured duration of the on-state period becoming greater than the threshold value.

[1-3-4. Control Unit 63] The control unit 63 is configured to control a change speed of a gate voltage of the switching device 2 during a turn-off time period of the switching device 2. The control unit 63 may be configured to set a change speed of a gate voltage of the switching device 2 during a period from a turn-off start of the switching device 2 to a timing when a reference time has elapsed since then to any of a plurality of speeds, based on the parameter measured by the parameter measuring unit 621 (in the present embodiment, as an example, the duration of the on-state period of the switching device 2). Also, the control unit 63 may be configured to switch the change speed of the gate voltage from a speed S1 to a speed S2 or to keep the change speed at a speed S3 at a timing when a reference time has elapsed since the turn-off start during the next turn-off time period of the switching device 2, based on the measured parameter.

In the present embodiment, as an example, if the discrepancy is not detected based on the duration of the on-state period by the discrepancy detection unit 62, the control unit 63 switches the change speed of the gate voltage of the switching device 2 from the speed S1 to the speed S2 at the timing when the reference time has elapsed since the turn-off start during the next turn-off time period, and if the discrepancy is detected, the control unit 63 keeps the change speed of the gate voltage at the speed S3 during the next turn-off time period of the switching device 2. The control unit 63 may be configured to use the previous elapsed time, as the reference time.

The speed S1 may be greater than each of the speed S2 and the speed S3. The speed S2 and the speed S3 may be the same or different from each other. In the present embodiment, as an example, the speed S2 is greater than the speed S3.

The control unit 63 includes a gate resistor 630, a connection switching unit 631, and a switching determination unit 632.

[1-3-4-1. Gate Resistor 630] The gate resistor 630 includes three resistors 6301 to 6303 of which resistance values are different. The resistor 6301 has a resistance value R1 by which the change speed of the gate voltage of the switching device 2 is set to the speed S1 during the turn-off time period. Similarly, the resistor 6302 has a resistance value R2 by which the change speed of the gate voltage of the switching device 2 is set to the speed S2 during the turn-off time period. Also, the resistor 6303 has a resistance value R3 by which the change speed of the gate voltage of the switching device 2 is set to the speed S3 during the turn-off time period. The resistance values R1 to R3 may meet a relation of R1<R2 and R1<R3, and in the present embodiment, meets a relation of R1<R2<R3, as an example. The resistance value R3 may be the same as the resistance value R2 or less than the resistance value R2 inasmuch as the surge voltage, which is generated when the resistor is connected to the gate of the switching device 2 over the turn-off time period, does not exceed the device breakdown voltage. The resistors 6301 to 6303 have respectively one end connected to the gate of the switching device 2 and the other end connected to the gate drive unit 60. In the meantime, the gate resistor 630 may have another configuration inasmuch as it can change the resistance value during the turn-off time period of the switching device 2.

[1-3-4-2. Connection Switching Unit 631] The connection switching unit 631 is configured to switch the resistance value of the gate resistor 630. Thereby, the change speed of the gate voltage is switched. In the present embodiment, as an example, the connection switching unit 631 is configured to selectively connect any one of the three resistors 6301 to 6303 to the gate. The connection switching unit 631 may include three switches 6311 to 6313 each provided between each of the resistors 6301 to 6303 and the gate, and may be configured to connect any one of the resistors 6301 to 6303 to the gate, in response to an instruction signal from the switching determination unit 632.

[1-3-4-3. Switching Determination Unit 632] The switching determination unit 632 is configured to determine whether or not to switch the change speed of the gate voltage, based on the signals supplied from the elapsed time measuring unit 61 and the discrepancy detection unit 62. The switching determination unit 632 may include a NOR gate 6321 having an output terminal connected to the switch 6312, and may be configured to supply the timing signal from the elapsed time measuring unit 61 to the switch 6311 and the NOR gate 6321, and to supply the detection signal from the discrepancy detection unit 62 to the switch 6313 and the NOR gate 6321.

Thereby, when the discrepancy signal is low, i.e., when the current flowing through the switching device 2 in the on-state does not deviate from the reference value, the switch 6311 becomes on during a period, in which the timing signal is high, of the turn-off time period of the switching device 2, so that the resistor 6301 is connected, and the switch 6312 becomes on during a period in which the timing signal is low, so that the resistor 6302 is connected. Also, when the discrepancy signal is high, i.e., when the current flowing through the switching device 2 in the on-state deviates from the reference value, the switch 6313 becomes on during the turn-off time period of the switching device 2, so that the resistor 6303 is connected.

[1-3-5. Correction Unit 65] The correction unit 65 is configured to correct the reference time to be used during the next turn-off time period of the switching device 2, based on the change speed of the gate voltage during a period from a previous turn-off start of the switching device 2 to the timing when the reference time has elapsed since then. The correction unit 65 is interposed between the elapsed time measuring unit 61 and the control unit 63, and may be configured to correct a switching timing of the timing signal to be supplied from the elapsed time measuring unit 61 to the control unit 63.

The correction unit 65 may correct the reference time to be used during the next turn-off time period of the switching device 2, if the change speed of the gate voltage during the period from the previous turn-off start of the switching device 2 to the timing when the reference time has elapsed since then is the speed S3 (in the present embodiment, as an example, when the resistor 6303 is connected to the gate). The correction unit 65 may be configured to correct the reference time to be used during the next turn-off time period so as to be shorter than the original reference time (in the present embodiment, as an example, the previous elapsed time). The correction unit 65 may be configured to correct the reference time by curtailing the falling timing of the timing signal from the elapsed time measuring unit 61, and to supply the timing signal to the control unit 63.

Herein, when the change speed of the gate voltage is the speed S3 (S3<S1) so as to suppress the surge voltage during the previous turn-off time period, the previous elapsed time becomes longer, as compared to a case in which the change speed is the speed S1. When the previous elapsed time is used as the reference time, as it is, and the change speed of the gate voltage is changed from the speed S1 to the speed S2 at the timing when the reference time has elapsed since the turn-off start, the surge voltage becomes the highest earlier than the switching timing and exceeds the device breakdown voltage, so that the device may be broken. In this case, the reference time is corrected, so that the switching timing can be made to be earlier than the peak of the surge voltage.

In the meantime, the correction unit 65 may not correct the reference time during the next turn-off time period, if the change speed of the gate voltage during the previous turn-off time period from the turn-off start of the switching device 2 to the timing when the reference time has elapsed since then is the speed S1 (in the present embodiment, as an example, when the resistor 6301 is connected). The correction unit 65 may be configured to supply the timing signal from the elapsed time measuring unit 61 to the control unit 63, as it is.

Also, if the discrepancy is detected by the discrepancy detection unit 62, the correction unit 65 may not supply the timing signal to the control unit 63, and may supply the timing signal from the elapsed time measuring unit 61 to the control unit 63, as it is.

According to the switching apparatus 100, based on whether the change speed of the gate voltage during the period from the previous turn-off start of the switching device 2 to the timing when the reference time has elapsed since then is set to any of the plurality of speeds, the reference time to be used during the next turn-off of the switching device 2 and the switching timing of the change speed of the gate voltage are corrected by the correction unit 65. Therefore, it is possible to set the switching timing of the change speed of the gate voltage earlier than the peak timing of the surge voltage during the next turn-off time period, according to the change speed of the gate voltage during the previous turn-off time period. Therefore, it is possible to securely switch the change speed of the gate voltage earlier than the peak timing of the surge voltage, thereby reducing the surge voltage to prevent the device destruction.

Also, the change speed of the gate voltage is changed from the speed S1 to the speed S2 or is kept at the speed S3 at the timing when the reference time has elapsed since the turn-off start during the next turn-off time period of the switching device 2, based on the measured parameter. Therefore, the reference time is corrected, so that the device destruction can be prevented when the change speed of the gate voltage is switched from the speed S1 to the speed S2.

Also, if the discrepancy between the current flowing through the switching device 2 during the on-state of the switching device 2 and the reference value is not detected, the change speed of the gate voltage is changed at the timing when the reference time has elapsed since the turn-off start during the next turn-off time period of the switching device 2. Therefore, the change speed is made fast to the timing when the reference time has elapsed and the change speed is made slow after the timing when the reference time has elapsed, thereby reducing the switching loss and the surge voltage. Also, if the discrepancy is detected, the change speed is kept during the next turn-off time period of the switching device 2. Therefore, when the surge voltage excessively increases (as an example, exceeds the device breakdown voltage) as the current flowing through the switching device 2 in the on-state increases and the change speed of the gate voltage after the reference time since the turn-off start during the next turn-off time period is switched, the surge voltage can be suppressed without the switching.

Also, the reference time is a time from the turn-off start of the switching device 2 to the timing earlier than the timing at which the voltage $V_{ds}$ between the main terminals of the switching device 2 is the highest. Therefore, it is possible to reduce the peak voltage between the main terminals of the switching device 2, thereby securely suppressing the surge voltage in the switching apparatus 100.

Also, since the speed S2 of the gate voltage after the reference time becomes less than the speed S1 of the gate voltage during the period from the turn-off start of the switching device 2 to the reference time during the turn-off time period of the switching device 2, if the discrepancy of the current is not detected, the change speed of the gate voltage after the reference time can be made small, thereby suppressing the surge voltage. Also, if the discrepancy of the current is detected, since the change speed of the gate voltage is kept at the speed S3 less than the speed S1, the surge voltage can be further suppressed, as compared to a case in which the change speed of the gate voltage is kept at the speed S1. Also, since the speed S3 is less than the speed S2, it is possible to securely suppress the surge voltage when the discrepancy of the current is detected.

Also, when the change speed of the gate voltage during the period from the previous turn-off start of the switching device 2 to the timing when the reference time has elapsed since then is the speed S3, the reference time to be used during the next turn-off time period of the switching device 2 is corrected. Therefore, in a case in which the surge voltage exceeds the device breakdown voltage if the change speed of the gate voltage during the turn-off time period continues to be kept at the speed S1, the change speed is switched earlier than the peak timing of the surge voltage, so that the device destruction can be prevented.

Also, since the parameter is the duration of the on-state period of the switching device 2, it is possible to securely detect the discrepancy of the current flowing through the switching device 2.

2. Operations

Figure 2:
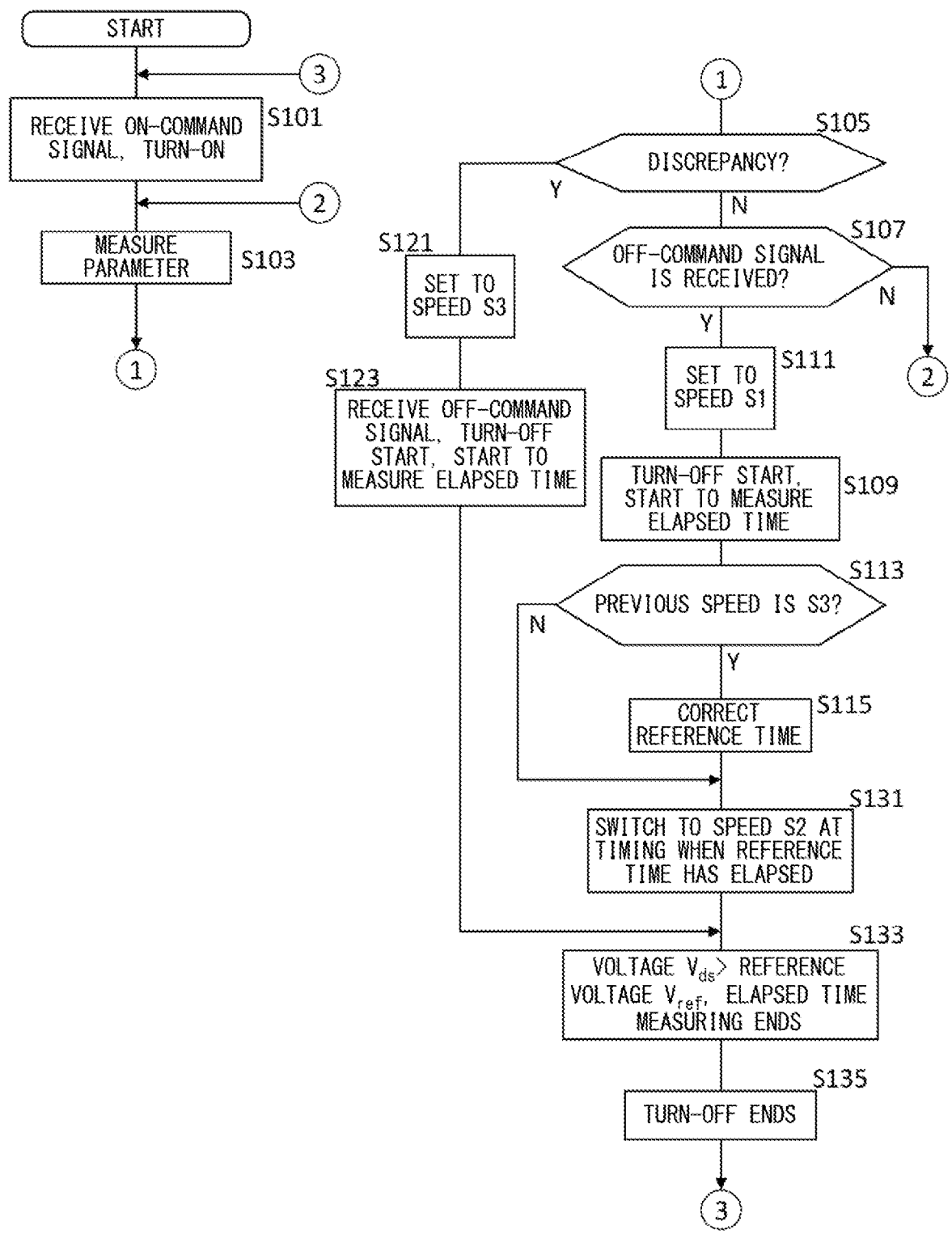
FIG. 2 shows operations of a gate drive apparatus 6.

FIG. 2 shows operations of the gate drive apparatus 6. The gate drive apparatus 6 executes processing of steps S101 to S135, thereby driving the gate of the switching device 2.

In step S101, the gate drive unit 60 receives the on-command signal included in the input signal from an outside, and turns on the switching device 2.

In step S103, the parameter measuring unit 621 of the discrepancy detection unit 62 receives the on-command signal included in the input signal to the gate drive unit 60, and measures the parameter corresponding to the current flowing through the switching device 2 (in the present embodiment, as an example, a duration of the on-state period).

In step S105, the comparator 622 of the discrepancy detection unit 62 determines whether the current flowing through the switching device 2 deviates from the reference value, based on the parameter supplied from the parameter measuring unit 621 (the measured duration of the on-state period). For example, the comparator 622 may determine that the current deviates from the reference value, when the measured parameter is greater than the threshold value, i.e., the value obtained by adding the margin to the reference value. When it is determined that the current deviates from the reference value (step S105; Yes), the gate drive apparatus 6 proceeds to processing of step S121, and when it is determined that there is no discrepancy (step S105; No), the gate drive apparatus 6 proceeds to processing of step S107.

In step S121, the control unit 63 sets the change speed of the gate voltage during the turn-off time period to the speed S3. In the present embodiment, as an example, the control unit 63 connects the resistor 6303 to the gate of the switching device 2.

In step S123, the gate drive unit 60 receives the off-command signal included in the input signal from the outside, and outputs a gate drive signal for turn-off instruction, thereby starting the turn-off of the switching device 2. Also, the elapsed time storage unit 613 of the elapsed time measuring unit 61 starts measurement of the elapsed time up to a timing at which the reference event (in the present embodiment, as an example, the voltage $V_{ds}$ between the main terminals of the switching device 2 reaches the reference voltage $V_{ref}$) occurs. Then, the gate drive apparatus 6 proceeds to processing of step S133.

In step S107, the gate drive apparatus 6 determines whether the off-command signal included in the input signal from the outside is received. When it is determined that the off-command signal is not received (step S107; No), the gate drive apparatus 6 proceeds to processing of step S103. When it is determined that the off-command signal is received (step S107; Yes), the gate drive apparatus 6 proceeds to processing of step S109.

In step S109, the control unit 63 sets the change speed of the gate voltage during the turn-off time period to the speed S1. In the present embodiment, as an example, the control unit 63 connects the resistor 6301 to the gate of the switching device 2.

In step S111, the gate drive unit 60 outputs a gate drive signal for turn-off instruction, thereby starting the turn-off of the switching device 2. Also, the elapsed time storage unit 613 of the elapsed time measuring unit 61 starts measurement of the elapsed time up to the timing at which the reference event (in the present embodiment, as an example, the voltage $V_{ds}$ between the main terminals of the switching device 2 reaches the reference voltage $V_{ref}$) occurs.

In step S113, the correction unit 65 determines whether the change speed of the gate voltage during the previous turn-off time period was the speed S3. In the present embodiment, as an example, when the discrepancy is detected by the discrepancy detection unit 62 while the switching device 2 is in the on-state immediately before the previous turn-off time period, the correction unit 65 determines that the change speed of the gate voltage during the period from the previous turn-off start of the switching device 2 to the timing when the reference time has elapsed since then was the speed S3. When it is determined that the change speed of the gate voltage was the speed S3 (step S113; Yes), the gate drive apparatus 6 proceeds to processing of step S115, and when it is determined that the change speed of the gate voltage was not the speed S3 (step S113; No), the gate drive apparatus 6 proceeds to processing of step S131.

In step S115, the correction unit 65 corrects the reference time. The correction unit 65 converts the previous elapsed time in the case in which the change speed of the gate voltage is the speed S3 into the elapsed time in the case in which the change speed is the speed S1, and sets the same as the reference time. Herein, the previous elapsed time in the case of the speed S3 indicates an elapsed time from the turn-off start of the switching device 2 to the timing when the voltage $V_{ds}$ reaches the reference voltage $V_{ref}$ during the previous turn-off time period in which the change speed of the gate voltage is set to the speed S3. The elapsed time in the case of the speed S1 indicates an elapsed time from the turn-off start of the switching device 2 to the timing when the voltage $V_{ds}$ reaches the reference voltage $V_{ref}$ in the case in which the change speed of the gate voltage is set to the speed S1.

For example, the correction unit 65 may convert the elapsed time in the case of the speed S3 into the elapsed time in the case of the speed S1 by counting down the previous elapsed time with a count speed corresponding to a ratio of the speed S3 to the speed S1. The count speed corresponding to a ratio of the speed S3 to the speed S1 may be a count speed obtained by multiplying a reference count speed by S3/S1 (or a value obtained by performing addition, subtraction, multiplying or the like of a coefficient for S3/S1). As an example, the reference count speed may be a speed corresponding to the speed S3, or may be set based on a gradient when a relation between a magnitude of drain current when the change speed of the gate voltage is set to the speed S3 and a duration of the elapsed time measured by the elapsed time measuring unit 61 is approximated to a linear function. In contrast, the count speed corresponding to a ratio of the speed S3 to the speed S1 may be a speed corresponding to the speed S1 or may be set based on a gradient when a relation between a magnitude of drain current when the change speed of the gate voltage is set to the speed S1 and a duration of the elapsed time measured by the elapsed time measuring unit 61 is approximated to a linear function.

In the present embodiment, as an example, the correction unit 65 may be an analog circuit. Although not shown, the correction unit 65 may include a source-type current source, a capacitor and a sink-type current source connected in series. The source-type current source may be enabled to charge the capacitor during a period from the reception timing of the off-command signal, which is included in the input signal to the gate drive unit 60 when the discrepancy signal is high, to the reception timing of the trigger signal output by the comparator 611. The sink-type current source may be enabled to charge the capacitor from the reception timing of the off-command signal, which is included in the input signal to the gate drive unit 60 when the discrepancy signal is low. Herein, magnitudes of current that is supplied from the source-type current source and current that flows through the sink-type current source may be determined according to the ratio of the speed S1 to the speed S3. Thereby, the elapsed time is counted down with the count speed corresponding to the ratio of the speed S3 to the speed S1, so that the elapsed time in the case of the speed S3 is converted into the elapsed time in the case of the speed S1.

In step S131, the control unit 63 switches the change speed of the gate voltage from the speed S1 to the speed S2 at the timing when the reference time has elapsed since the turn-off start. In the present embodiment, as an example, the control unit 63 connects the resistor 6302 to the gate of the switching device 2.

In step S133, the elapsed time measuring unit 61 completes the measurement of the elapsed time when the voltage $V_{ds}$ becomes higher than the reference voltage $V_{ref}$. The elapsed time storage unit 613 of the elapsed time measuring unit 61 may store the measured elapsed time as the previous elapsed time.

In step S135, the turn-off of the switching device 2 ends. Then, the gate drive apparatus 6 proceeds to processing of step S101.

According to the operations as described above, since the previous elapsed time in the case in which the change speed of the gate voltage is the speed S3 is converted into the elapsed time in the case of the speed S1, it is possible to securely prevent the device destruction when the surge voltage exceeds the device breakdown voltage if the change speed of the gate voltage is kept at the speed S1 during the turn-off time period.

Also, the previous elapsed time in the case of the speed S3 is converted into the elapsed time in the case of the speed S1 by counting down the elapsed time with the count speed corresponding to the ratio of the speed S3 to the speed S1, it is possible to simplify the configuration, as compared to a case in which the conversion is performed by calculation.

3. Operation Waveforms

Figure 3:
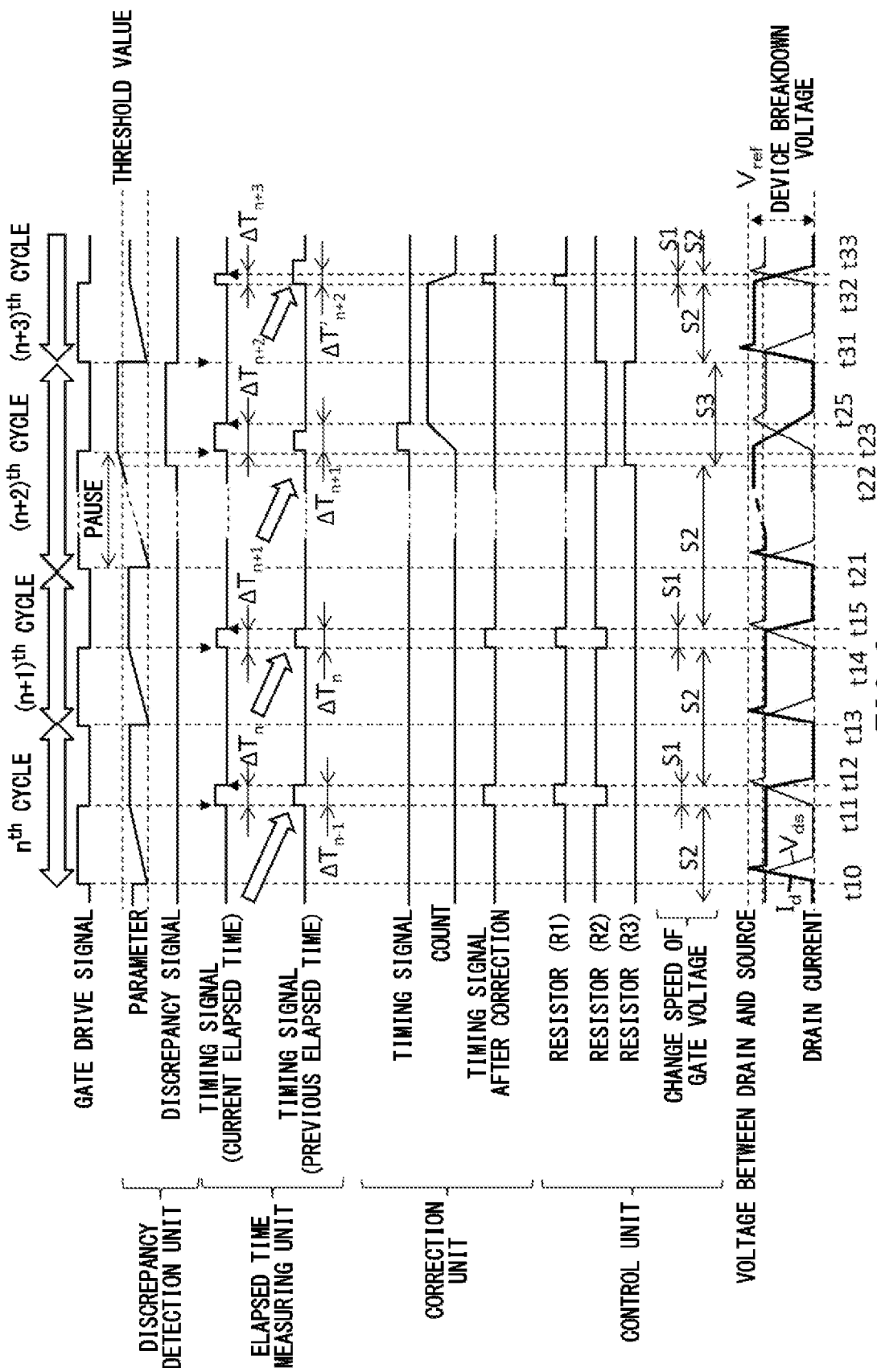
FIG. 3 shows operation waveforms upon gate drive by the gate drive apparatus 6.

FIG. 3 shows operation waveforms upon gate drive by the gate drive apparatus 6. In the operation example, the switching apparatus 100 performs modulation in a two-phase modulation manner, and the gate drive apparatus 6 pauses the switching to keep the switching device 2 in the on-state in a pause interval (time t21 to time t23) in a $(n+2)^{th}$ switching cycle. Also, the switching cycle is set as a time period after the input signal becomes high (on-command) until the input signal becomes high next time. However, the switching cycle may be set as a time period after the input signal becomes low (off-command) until the input signal becomes low next time.

At time t10 in an $n^{th}$ switching cycle, when the input signal to the switching device 2 is switched from low (off-command) to high (on-command), the switching device 2 turns on, so that the measurement of the parameter (in the present embodiment, as an example, the duration of on-state period) by the parameter measuring unit 621 of the discrepancy detection unit 62 starts.

At time t11, when the input signal to the switching device 2 is switched from high (on-command) to low (off-command), the measurement of the parameter is completed, so that the turn-off starts and the elapsed time $\Delta T_n$ (in the operation example, a time period from time t11 to time t12) until the voltage $V_{ds}$ reaches the reference voltage $V_{ref}$ is measured by the elapsed time measuring unit 61.

In the operation example, since the measured parameter does not exceed the threshold value (the value obtained by adding the margin to the reference value), the current flowing through the switching device 2 does not deviate from the reference value. For this reason, when the input signal is switched to low, an on-signal is input to the switch 6311, so that the resistor 6301 is connected to the gate. Thereby, the change speed of the gate voltage is set to the speed S1.

At time t12, when the reference time (here, the previous elapsed time $\Delta T_{n-1}$) has elapsed from time t11, an on-signal is input to the switch 6312, not the switch 6311, so that the resistor 6302 is connected to the gate. Thereby, the change speed of the gate voltage is switched to the speed S2. Then, the turn-off of the switching device 2 ends.

Similarly, at time t13 in a $(n+1)^{th}$ switching cycle, when the input signal to the switching device 2 is switched from low to high, the switching device 2 turns on, so that the measurement of the parameter by the parameter measuring unit 621 of the discrepancy detection unit 62 starts.

At time t14, when the input signal to the switching device 2 is switched from high to low, the measurement of the parameter is completed, so that the turn-off starts and the elapsed time $\Delta T_{n+1}$ (in the operation example, a time period from time t14 to time t15) until the voltage $V_{ds}$ reaches the reference voltage $V_{ref}$ is measured by the elapsed time measuring unit 61.

In the operation example, since the measured parameter does not exceed the threshold value, the current flowing through the switching device 2 does not deviate from the reference value. For this reason, when the input signal is switched to low, an on-signal is input to the switch 6311, so that the resistor 6301 is connected to the gate. Thereby, the change speed of the gate voltage is set to the speed S1.

At time t15, when the reference time (here, the previous elapsed time $\Delta T_n$) has elapsed from time t14, an on-signal is input to the switch 6312, not the switch 6311, so that the resistor 6302 is connected to the gate. Thereby, the change speed of the gate voltage is switched to the speed S2. Then, the turn-off of the switching device 2 ends. In the operation example, as an example, the elapsed time $\Delta T_{n-1}$ and the elapsed time $\Delta T_n$ are the same but may be different from each other.

Subsequently, at time t21 in a $(n+2)^{th}$ switching cycle, when the input signal to the switching device 2 is switched from low to high, the switching device 2 turns on, so that the measurement of the parameter by the parameter measuring unit 621 of the discrepancy detection unit 62 starts. In the operation example, the gate drive apparatus 6 is set to the pause interval of the switching from time t21 to time t23, and the input signal to the switching device 2 is kept high. Thereby, the parameter (in the present embodiment, as an example, the duration of the on-state period) corresponding to the current flowing through the switching device 2 continues to increase.

At time t22, when the parameter exceeds the threshold value, it is determined that the current flowing through the switching device 2 deviates from the reference value, and the discrepancy signal from the discrepancy detection unit 62 becomes high. Thereby, an on-signal is input to the switch 6313, so that the resistor 6303 is connected to the gate and the change speed of the gate voltage is set to the speed S3.

At time t23, when the input signal to the switching device 2 is switched from high to low, the measurement of the parameter is completed, so that the turn-off starts and the elapsed time $\Delta T_{n+2}$ (in the operation example, a time period from time t23 to time t25) until the voltage $V_{ds}$ reaches the reference voltage $V_{ref}$ is measured by the elapsed time measuring unit 61, and the turn-off of the switching device 2 ends.

Subsequently, at time t31 in a (n+3)$^{th}$ switching cycle, when the input signal to the switching device 2 is switched from low to high, the switching device 2 turns on, so that the measurement of the parameter by the parameter measuring unit 621 of the discrepancy detection unit 62 starts.

At time t32, when the input signal to the switching device 2 is switched from high to low, the measurement of the parameter is completed, so that the turn-off starts and the elapsed time $\Delta T_{n+3}$ (in the operation example, a time period from time t32 to time t34) until the voltage $V_{ds}$ reaches the reference voltage $V_{ref}$ is measured by the elapsed time measuring unit 61.

In the operation example, since the measured parameter does not exceed the threshold value, the current flowing through the switching device 2 does not deviate from the reference value. For this reason, when the input signal is switched to low, an on-signal is input to the switch 6311, so that the resistor 6301 is connected to the gate. Thereby, the change speed of the gate voltage is set to the speed S1.

Also, in the operation example, since the discrepancy is detected while the switching device 2 is in the previous on-state, i.e., from time t21 to time t23, the reference time (here, the previous elapsed time $\Delta T_{n+2}$) is corrected. In the operation example, as an example, when the discrepancy signal is high, the count-up is performed with the count speed corresponding to the speed S3 by the correction unit 65 during the measurement time period of the previous elapsed time $\Delta T_{n+2}$, and when the input signal to the switching device 2 is switched from high to low, the countdown of the previous elapsed time $\Delta T_{n+2}$ is performed with the count speed corresponding to the speed S1 by the correction unit 65. Thereby, a time period until the countdown completes becomes the elapsed time $\Delta T'_{n+2}$ after the correction.

At time t33, when the reference time (here, the previous elapsed time $\Delta T'_{n+2}$) has elapsed from time t32, an on-signal is input to the switch 6312, not the switch 6311, so that the resistor 6302 is connected to the gate. Thereby, the change speed of the gate voltage is switched to the speed S2. Then, the turn-off of the switching device 2 ends. In the operation example, as an example, the elapsed time $\Delta T'_{n+2}$ and the elapsed time $\Delta T_{n+3}$ are the same but may be different.

4. Modified Embodiment

Figure 4:
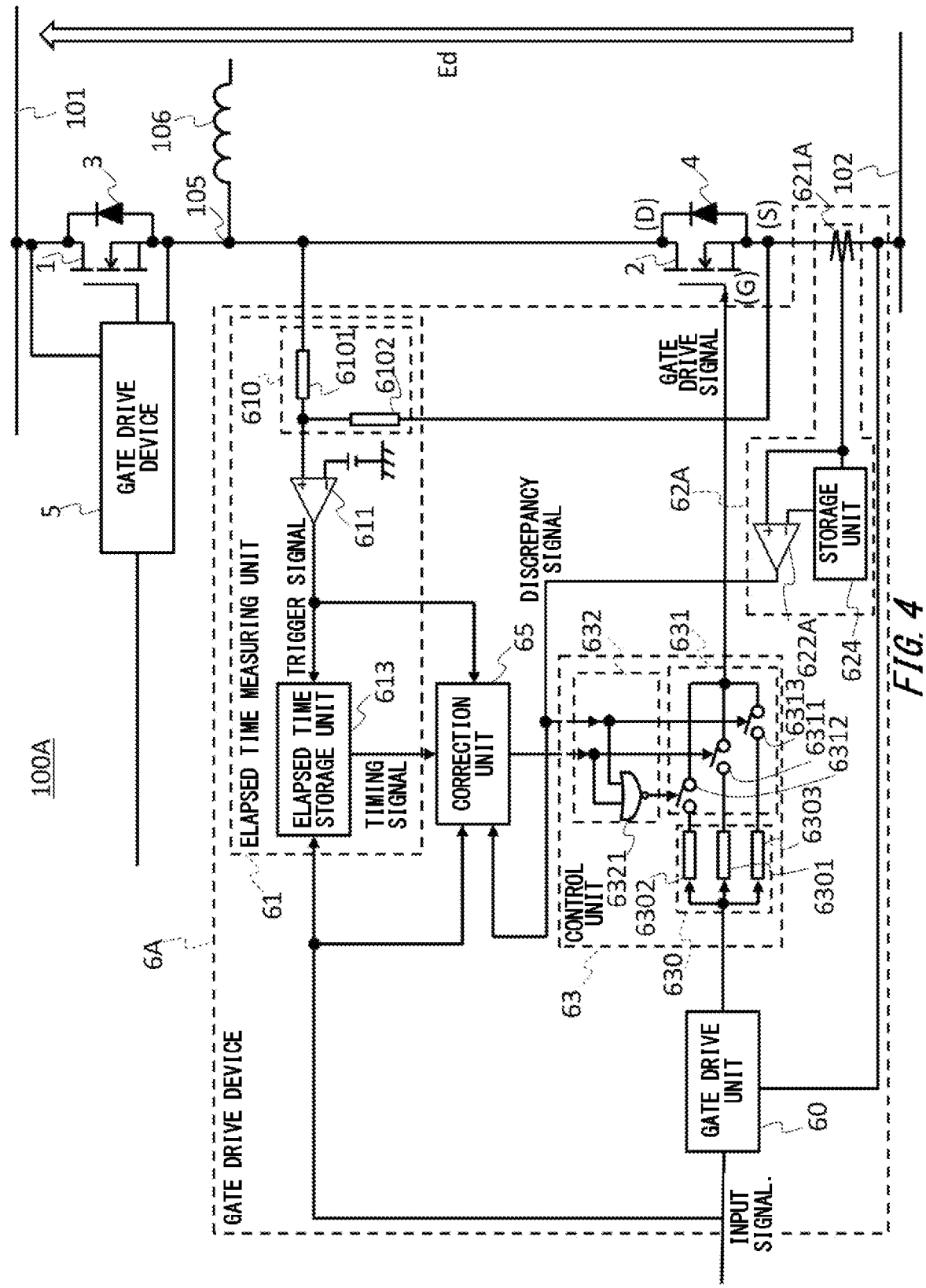
FIG. 4 shows a switching apparatus 100A in accordance with a modified embodiment.

FIG. 4 shows a switching apparatus 100A in accordance with a modified embodiment. In the modified embodiment, the substantially same configurations as those shown in FIG. 1 are denoted with the same reference signs, and the descriptions thereof are omitted.

A gate drive apparatus 6A of the switching apparatus 100A includes a discrepancy detection unit 62A. The discrepancy detection unit 62A includes a parameter measuring unit 621A, a storage unit 624 and a comparator 622A.

The parameter measuring unit 621A measures, as the parameter corresponding to the current flowing through the switching device 2, the current flowing through the switching device 2 when the switching device 2 is in the on-state. For example, the parameter measuring unit 621A may be configured to measure current $I_d$ flowing through the drain terminal. The parameter measuring unit 621A may be a current sensor. The parameter measuring unit 621A is configured to supply the measured parameter to the storage unit 624 and the comparator 622A.

The storage unit 624 is configured to store a reference value of the current flowing through the switching device in the on-state. For example, the storage unit 624 may be configured to store the parameter measured by the parameter measuring unit 621A, in each switching cycle. The storage unit 624 may be configured to supply, as the reference value, the parameter (in the modified embodiment, the current $I_d$ in the on-state) measured by the parameter measuring unit 621 while the switching device 2 is in the previous on-state to the comparator 622A.

The comparator 622A is configured to determine whether the current flowing through the switching device 2 deviates from the reference value, based on the parameter supplied from the parameter measuring unit 621. The parameter (in the modified embodiment, the current $I_d$ in the on-state) measured by the parameter measuring unit 621 while the switching device 2 is in the on-state is input to a non-inverting input terminal of the comparator 622A, and the reference value from the storage unit 624 (in the modified embodiment, the parameter measured while the switching device 2 is in the previous on-state) is input to an inverting input terminal.

The comparator 622A may have a hysteresis characteristic. The comparator 622A may be configured to output a discrepancy signal (in the modified embodiment, as an example, a discrepancy signal becoming high), which indicates the current deviates from the reference value, in response to the input to the non-inverting input terminal becoming higher than the input to the inverting input terminal by a preset hysteresis (margin).

According to the gate drive apparatus 6A as described above, since the current flowing through the switching device 2 during the on-state of the switching device 2 is measured as the parameter corresponding to the current flowing through the switching device 2, it is possible to securely detect the discrepancy of the current.

Also, since the parameter (in the modified embodiment, the current $I_d$ in the on-state) measured by the parameter measuring unit 621 during the previous on-state of the switching device 2 is used as the reference value of the current flowing through the switching device in the on-state, it is possible to detect the discrepancy between the current in the previous on-state and the current in the current on-state.

4. Other Modified Embodiments

In the above embodiment and the modified embodiment, the parameter corresponding to the current flowing through the switching device 2 has been described as the current $I_d$ or the duration of the on-state period but may be set to other values.

For example, the parameter may be a time from the turn-off start of the switching device 2 to a timing at which the voltage applied between the main terminals of the switching device 2 (in the present embodiment, as an example, the voltage $V_{ds}$ applied between the source terminal and the drain terminal) becomes the reference voltage $V_{ref}$. As the current $I_d$ flowing through the switching device 2 increases, the time becomes shorter. The reference voltage $V_{ref}$ may be a preset voltage between the DC voltage Ed and the peak voltage of the source drain voltage $V_{ds}$ during the turn-off time period of the switching device 2.

Also, the parameter may be a voltage that is applied to the switching device 2 after a second reference time since the turn-off start of the main switching device 2. The second reference time may be a duration of a time or shorter from the turn-off start to the turn-off end. As the current $I_d$ flowing through the switching device 2 increases, the voltage increases.

Also, the parameter may be the surge voltage that is generated when the switching device 2 is turned off. The surge voltage may be detected by the voltage detection circuit 610, for example. As the current $I_d$ flowing through the switching device 2 increases, the surge voltage increases.

Also, in the above embodiment and the modified embodiment, the control unit 63 switches the change speed of the gate voltage by switching the resistance value of the gate resistor 630 but may perform the switching by other methods. For example, the control unit 63 may reduce the current of the gate drive signal. In order to reduce the current of the gate drive signal, for example, an internal path of the gate drive signal toward the gate may be branched and split.

Also, the reference time for switching the change speed of the gate voltage from the speed S1 to the speed S2 is set as the elapsed time from the previous turn-off start of the switching device 2 to the timing at which the reference event occurs, and the reference event is described as the event in which the voltage $V_{ds}$ reaches the reference voltage $V_{ref}$. However, other times and other events may also be used. For example, the reference event may be an event in which a Miller time period of the gate voltage of the switching device 2 voltage ends. Also, the reference time may be a time from the previous turn-off start of the switching device 2 to a timing at which the Miller time period of the gate voltage ends. Also in this case, since it is possible to reduce the peak voltage between the main terminals of the switching device 2 and the surge voltage, it is possible to securely prevent the device destruction due to the surge voltage.

Also, the switching apparatus 100; 100A has been described as including a set of the main switching device 1 and the gate drive apparatus 5 on the positive side and a set of the main switching device 2 and the gate drive apparatus 6 on the negative side but may include only one set.

Also, each unit of the gate drive apparatus 6; 6A has been described as the analog circuit. However, at least one of the elapsed time measuring unit 61, the discrepancy detection unit 62, 62A, the control unit 63 and the correction unit 65 may include a digital circuit. In a case in which the discrepancy detection unit 62; 62A is a digital circuit, the discrepancy detection unit 62; 62A may include a filter unit configured to extract only a parameter, which exceeds the threshold value (a value obtained by adding the margin to the reference value), of the measured parameters. In a case in which the correction unit 65 is a digital circuit, the correction unit 65 may be configured to convert the elapsed time in the case of the speed S3 into the elapsed time in the case of the speed S1 by counting down the previous elapsed time with the count speed corresponding to the ratio of the speed S3 to the speed S1. Also, the correction unit 65 may be configured to convert the elapsed time in the case of the speed S3 into the elapsed time in the case of the speed S1 by using a table in which the elapsed time in the case of the speed S3 into the elapsed time in the case of the speed S1 are associated.

Also, various embodiments of the present invention may be described with reference to flowcharts and block diagrams. Blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), a wide area network (WAN) such as the Internet, and the like. Thereby, the processor of a general purpose computer, special purpose computer, or other programmable data processing apparatus or the programmable circuitry can execute the computer-readable instructions so as to create means for performing operations specified in the flowcharts or block diagrams. Examples of the processor include a computer processor, a processing unit, a microprocessor, a digital signal processor, a controller, a microcontroller, and the like.

Figure 5:
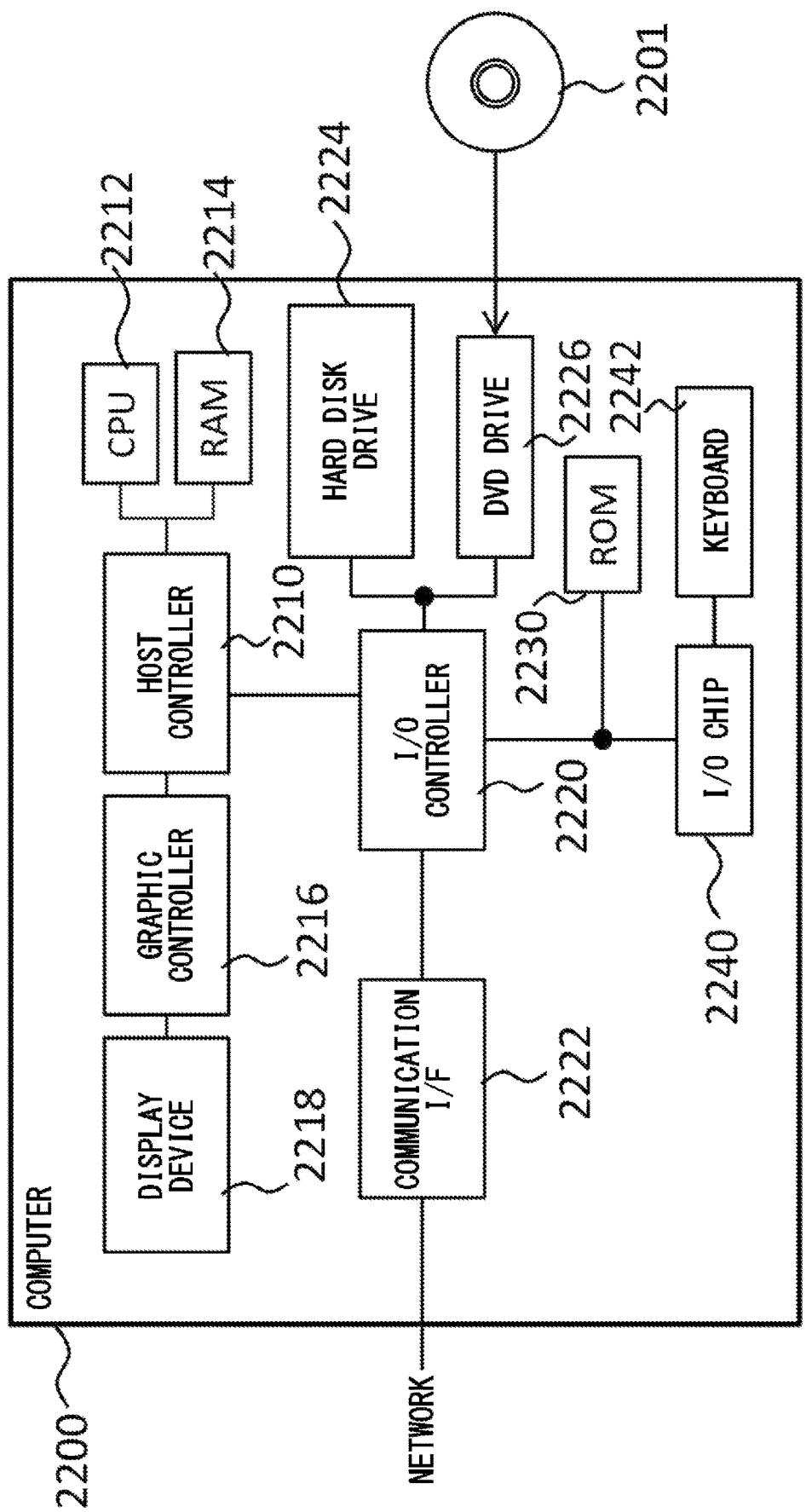
FIG. 5 shows an example of a computer 2200 in which a plurality of aspects of the present invention may be wholly or partially embodied.

FIG. 5 shows an example of a computer 2200 in which a plurality of aspects of the present invention may be wholly or partially embodied. A program that is installed in the computer 2200 can cause the computer 2200 to function as or perform operations associated with apparatus of the embodiments of the present invention or one or more sections thereof, and/or cause the computer 2200 to perform processes of the embodiments of the present invention or steps thereof. Such a program may be executed by a CPU 2212 so as to cause the computer 2200 to perform certain operations associated with some or all of the blocks of flowcharts and block diagrams described herein.

The computer 2200 according to the present embodiment includes a CPU 2212, a RAM 2214, a graphic controller 2216, and a display device 2218, which are mutually connected by a host controller 2210. The computer 2200 also includes input/output units such as a communication interface 2222, a hard disk drive 2224, a DVD-ROM drive 2226 and an IC card drive, which are connected to the host controller 2210 via an input/output controller 2220. The computer also includes legacy input/output units such as a ROM 2230 and a keyboard 2242, which are connected to the input/output controller 2220 via an input/output chip 2240.

The CPU 2212 operates according to programs stored in the ROM 2230 and the RAM 2214, thereby controlling each unit. The graphic controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data to be used by the CPU 2212 within the computer 2200. The DVD-ROM drive 2226 reads the programs or the data from the DVD-ROM 2201, and provides the hard disk drive 2224 with the programs or the data via the RAM 2214. The IC card drive reads programs and data from an IC card, and/or writes programs and data into the IC card.

The ROM 2230 stores therein a boot program or the like executed by the computer 2200 at the time of activation, and/or a program depending on the hardware of the computer 2200. The input/output chip 2240 may also connect various input/output units to the input/output controller 2220 via a parallel port, a serial port, a keyboard port, a mouse port, and the like.

A program is provided by computer readable media such as the DVD-ROM 2201 or the IC card. The program is read from the computer readable media, installed into the hard disk drive 2224, the RAM 2214, or the ROM 2230, which are also examples of computer readable media, and is executed by the CPU 2212. The information processing described in these programs is read into the computer 2200, resulting in cooperation between a program and the above-mentioned various types of hardware resources. An apparatus or method may be constituted by realizing the operation or processing of information in accordance with the usage of the computer 2200.

For example, when communication is performed between the computer 2200 and an external device, the CPU 2212 may execute a communication program loaded onto the RAM 2214 to instruct communication processing to the communication interface 2222, based on the processing described in the communication program. The communication interface 2222, under control of the CPU 2212, reads transmission data stored on a transmission buffering region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., and perform various types of processing on the data on the RAM 2214. The CPU 2212 may then write back the processed data to the external recording medium.

Various types of information, such as various types of programs, data, tables, and databases, may be stored in the recording medium to undergo information processing. The CPU 2212 may perform various types of processing on the data read from the RAM 2214, which includes various types of operations, processing of information, condition judging, conditional branch, unconditional branch, search/replace of information, etc., as described throughout this disclosure and designated by an instruction sequence of programs, and writes the result back to the RAM 2214. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-explained program or software modules may be stored in the computer 2200 or in the computer readable media near the computer 2200. In addition, a recording medium such as a hard disk or a RAM provided in a server system connected to a dedicated communication network or the Internet can be used as the computer readable media, thereby providing the program to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1: switching device, 2: switching device, 3: freewheeling diode, 4: freewheeling diode, 5: gate drive apparatus, 6: gate drive apparatus, 60: gate drive unit, 61: elapsed time measuring unit, 62: discrepancy detection unit, 63: control unit, 65: correction unit, 100: switching apparatus, 101: positive-side power supply line, 102: negative-side power supply line, 105: power supply output terminal, 106: induction load, 610: voltage detection circuit, 611: comparator, 613: elapsed time storage unit, 621: parameter measuring unit, 622: comparator, 624 storage unit, 630: gate resistor, 631: connection switching unit, 632: switching determination unit, 2200: computer, 2201: DVD-ROM, 2210: host controller, 2212: CPU, 2214: RAM, 2216: graphic controller, 2218:

display device, 2220: input/output controller, 2222: communication interface, 2224: hard disk drive, 2226: DVD-ROM drive, 2230: ROM, 2240: input/output chip, 2242: keyboard, 6101: resistor, 6102: resistor, 6301: resistor, 6302: resistor, 6303: resistor, 6311: switch, 6312: switch, 6313: switch, 6321: NOR gate

What is claimed is:

1. A gate drive method comprising:
   measuring a parameter corresponding to current flowing through a switching device when driving a gate of the switching device;
   controlling of setting a change speed of a gate voltage of the switching device based on the parameter; and
   correcting a reference time based on a change speed of the gate voltage;
   wherein the controlling the change speed of the gate voltage includes maintaining the change speed as long as the parameter exceeds a threshold value.

2. The gate drive method according to claim 1, wherein the controlling includes setting the change speed of the gate voltage of the switching device during a period from a turn-off start of the switching device to a timing when the reference time has elapsed since then to any of a plurality of speeds.

3. The gate drive method according to claim 2, wherein the correcting includes correcting the reference time to be used during a next turn-off time period of the switching device, based on a change speed of the gate voltage during a period from a previous turn-off start of the switching device to the timing when the reference time has elapsed since then.

4. The gate drive method according to claim 3, wherein the controlling includes switching the change speed of the gate voltage from a speed S1 to a speed S2 or to keep the change speed at a speed S3 at a timing when a reference time has elapsed since the turn-off start during the turn-off time period of the switching device, based on the parameter.

5. The gate drive method according to claim 4, wherein the speed S1 is greater than each of the speed S2 and the speed S3.

6. The gate drive method according to claim 4, wherein the correcting includes correcting the reference time if the change speed of the gate voltage during the period from the previous turn-off start of the switching device to the timing when the reference time has elapsed since then is the speed S3.

7. The gate drive method according to claim 6, further comprising measuring an elapsed time from a turn-off start of the switching device to a timing at which a reference event occurs, in each switching cycle,
   wherein the controlling includes using, as the reference time, the elapsed time in a previous switching cycle, and
   the correcting includes converting the elapsed time in the previous switching cycle in a case in which the change speed of the gate voltage is the speed S3 into the elapsed time in a case in which the change speed is the speed S1.

8. The gate drive method according to claim 7, wherein the correcting includes converting the elapsed time in the case of the speed S3 into the elapsed time in the case of the speed S1 by counting down the elapsed time with a count speed corresponding to a ratio of the speed S3 to the speed S1.

9. The gate drive method according to claim 7, wherein the reference event is an event in which a voltage between main terminals of the switching device becomes a reference voltage.

10. The gate drive method according to claim 7, wherein the reference event is an event in which a Miller time period of the gate voltage of the switching device ends.

11. The gate drive method according to claim 1, wherein the parameter is a duration of an on-state period of the switching device.

12. The gate drive method according to claim 1, wherein the parameter is current flowing through the switching device when the switching device is in an on-state.

13. The gate drive method according to claim 1, further comprising driving the gate of the switching device.

14. The gate drive method according to claim 13, wherein the switching device is a wide bandgap semiconductor element.

15. A gate drive method comprising:
    measuring a parameter concerning a switching device;
    setting a change speed of a gate voltage of the switching device based on the parameter; and
    resetting the change speed of the gate voltage of the switching device if the parameter exceeds a threshold value;
    wherein the reset change speed of the gate voltage of the switching device is maintained as long as the parameter exceeds the threshold value.

16. The gate drive method of claim 15, wherein:
    the parameter relates to current.

17. The gate drive method of claim 15, wherein:
    the parameter relates to the length of time the switching device is in an on state.

18. A gate drive method comprising:
    measuring a parameter concerning a switching device corresponding to current flowing through the switching device when driving a gate of the switching device;
    setting a change speed of a gate voltage of the switching device based on the parameter; and
    resetting the change speed of the gate voltage of the switching device if the parameter exceeds a threshold value.

19. The gate drive method of claim 18, wherein:
    the reset change speed of the gate voltage of the switching device is maintained as long as the parameter exceeds the threshold value.

20. The gate drive method of claim 18, wherein:
    for each switching cycle when the switching device is turned off and on, measuring an elapsed time from when the switching device is turned off until the voltage from the drain to the source of the switching device reaches a reference value; and
    using the measured elapsed time as a reference time during which the change speed of the gate voltage of the switching device is reset.

* * * * *